(12) United States Patent
Reznicek et al.

(10) Patent No.: US 12,490,501 B2
(45) Date of Patent: Dec. 2, 2025

(54) VERTICALLY STACKED CASCODE BIPOLAR JUNCTION TRANSISTOR (BJT) PAIR SENSOR

(71) Applicant: International Business Machines Corporation, Armonk, NY (US)

(72) Inventors: Alexander Reznicek, Troy, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 701 days.

(21) Appl. No.: 17/672,941

(22) Filed: Feb. 16, 2022

(65) Prior Publication Data

US 2023/0260990 A1 Aug. 17, 2023

(51) Int. Cl.
*H10D 84/60* (2025.01)
*H10D 10/01* (2025.01)
*H10D 10/40* (2025.01)
*H10D 64/27* (2025.01)

(52) U.S. Cl.
CPC ......... *H10D 84/615* (2025.01); *H10D 10/051* (2025.01); *H10D 10/40* (2025.01); *H10D 64/281* (2025.01)

(58) Field of Classification Search
CPC .... H10D 64/281; H10D 10/051; H10D 10/40; H10D 84/615
See application file for complete search history.

(56) References Cited

U.S. PATENT DOCUMENTS

| | | | |
|---|---|---|---|
| 6,858,876 | B2 | 2/2005 | Gordon |
| 8,062,491 | B1 | 11/2011 | Gau |
| 8,420,494 | B1 | 4/2013 | Holm-Kennedy |
| 10,374,070 | B2 | 8/2019 | Wood |
| 10,411,109 | B2 | 9/2019 | Reznicek |
| 10,488,365 | B2 | 11/2019 | Aparin |
| 10,724,983 | B2 | 7/2020 | Liu |
| 11,021,748 | B2 | 6/2021 | Esfandyarpour |
| 2016/0370313 | A1* | 12/2016 | Aparin ............... G01N 21/27 |
| 2023/0123050 | A1 | 4/2023 | Hekmatshoartabari et al. |

FOREIGN PATENT DOCUMENTS

CA 2619000 A 6/2009

OTHER PUBLICATIONS

Tony R. Kuphaldt et al., The Cascode Amplifier, Chapter 4—Bipolar Junction Transistors, https://www.allaboutcircuits.com/textbook/semiconductors/chpt-4/cascode-amplifier/, downloaded Nov. 9, 2021, pp. 1-2.

(Continued)

*Primary Examiner* — Tucker J Wright
(74) *Attorney, Agent, or Firm* — Kelsey M. Skodje; Otterstedt & Kammer PLLC

(57) ABSTRACT

A sensor device includes a vertically stacked cascode bipolar junction transistor pair, and a first trench having a first sidewall, wherein a portion of the first sidewall is provided by the first sensing surface, wherein a bipolar junction transistor and a dual-base bipolar junction transistor of the cascode bipolar junction transistor pair are stacked vertically along the first trench.

20 Claims, 17 Drawing Sheets

(56) References Cited

OTHER PUBLICATIONS

Alicja Konczakowska et al., Chapter 11, Noise in Semiconductor Devices, Fundamentals of Industrial Electronics, Jun. 22, 2010, pp. 1-12.
No Author. "Lecture Notes", Microelectronic Devices and Circuits, retrieved from web https://ocw.mit.edu/courses/6-012-microelectronic-devices-and-circuits-fall-2009/pages/lecture-notes/, 2009, 2 pages.
Vashistha et al. "Futuristic biosensors for cardiac health care: an artificial intelligence approach", 3 Biotech, Aug. 3, 2018, 11 pages, vol. 8, Issue No. 8.
Zafar et al. "A comparison between bipolar transistor and nanowire field effect transistor biosensors ", Applied Physics Letters, Feb. 12, 2015, Feb. 9, 2015, 6 pages, vol. 106, Issue 6.

\* cited by examiner

FIG. 8
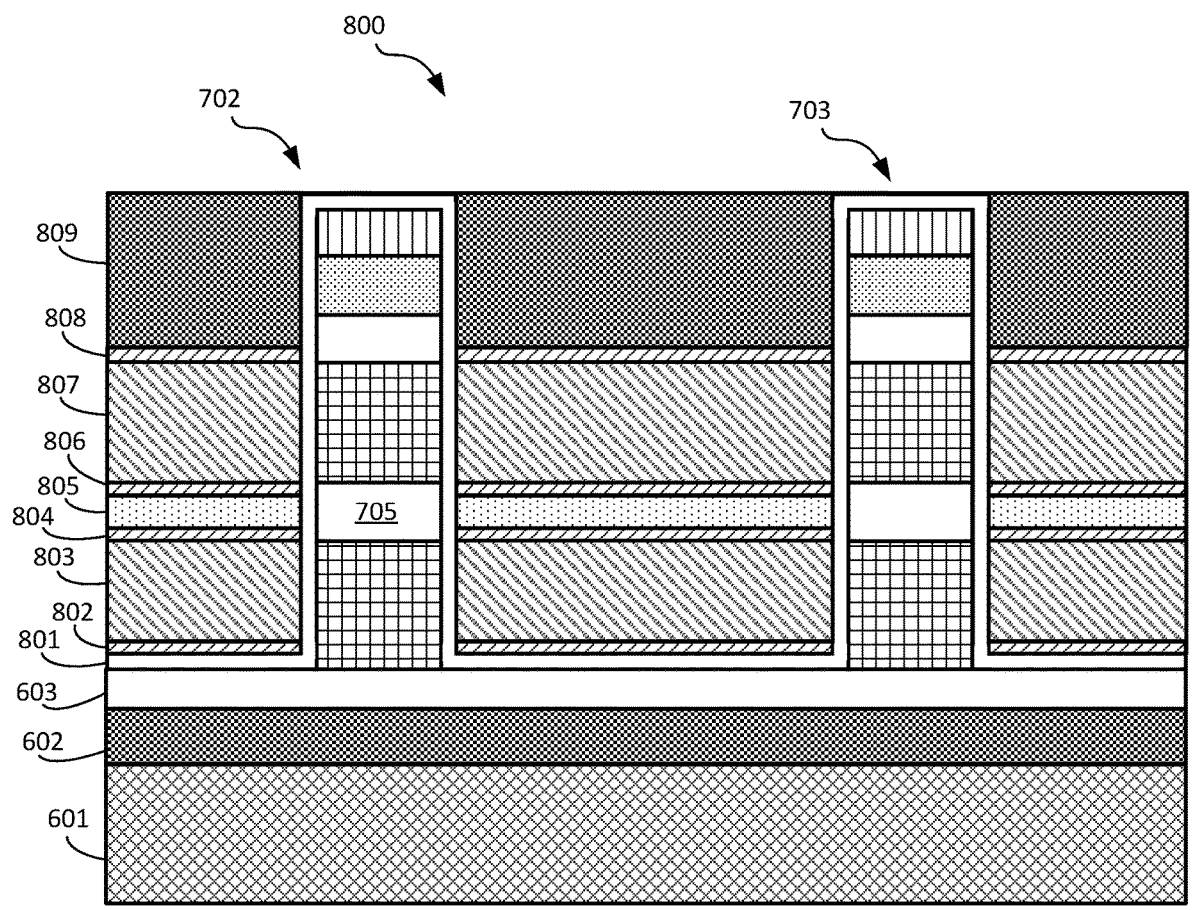
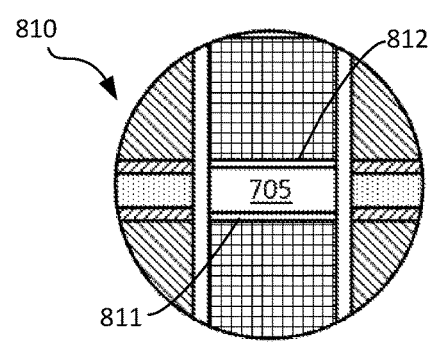

VERTICALLY STACKED CASCODE BIPOLAR JUNCTION TRANSISTOR (BJT) PAIR SENSOR

BACKGROUND

The present invention generally relates to sensors, and more particularly to sensors including vertically stacked cascode bipolar junction transistors.

Biosensors comprised of ion-sensitive transistors enable highly integrated biosensing systems that take advantage of artificial intelligence (AI) for various applications such as healthcare monitoring, point-of-care diagnostics, internet of things (IoT), and wearable devices.

Monolithic integration of these biosensors with the read-out/control circuitry is crucially important for energy-efficient, high-performance and mass-deployable systems.

In particular, an amplifier circuit monolithically integrated in close proximity of the biosensor is crucial for efficient amplification of the typically weak biological signals by eliminating the build-up of noise over long distances.

BRIEF SUMMARY

According to embodiments of the present invention, a sensor device includes: a vertically stacked cascode bipolar junction transistor pair including: a resistor; an NPN bipolar junction transistor connected to the resistor; and a dual-base NPN bipolar junction transistor comprising a sensing base and a first sensing surface connected to the sensing base; and a first trench having a first sidewall, wherein a portion of the first sidewall is provided by the first sensing surface, wherein the NPN bipolar junction transistor and the dual-base NPN bipolar junction transistor are stacked vertically along the first trench.

According to some embodiments, a sensor device includes: a vertically stacked cascode bipolar junction transistor pair including: a dual-base PNP bipolar junction transistor comprising a sensing base and a first sensing surface connected to the sensing base; a PNP bipolar junction transistor connected to the dual-base PNP bipolar junction transistor; and a resistor; and a first trench having a first sidewall, wherein a portion of the first sidewall is provided by the first sensing surface, wherein the PNP bipolar junction transistor and the dual-base PNP bipolar junction transistor are stacked vertically along the first trench.

According to some embodiments, a method of manufacturing a sensor device comprising a vertically stacked cascode bipolar junction transistor pair, the method including providing a stack including a substrate, an isolation layer, an emitter layer, a first base layer, a collector-emitter layer, a second base layer, a collector layer, and a resistor layer; patterning the stack to form a first fin and a second fin; sequentially forming an oxide liner, a bottom spacer material, a first sacrificial material, a first spacer layer, a second sacrificial material, a third spacer layer, and a silicon oxide layer; forming a first sample trench between the first fin and the second fin; forming first cavities by removing the first sacrificial material and the second sacrificial material; forming a plurality of extrinsic bases in the first cavities, the plurality of extrinsic bases including an upper extrinsic base and a lower extrinsic base; forming vertical cavities in the plurality of extrinsic bases; forming vertical spacers in the vertical cavities, the vertical spacers including an upper vertical spacer and a lower vertical spacer; forming a hanging spacer, which protects the upper extrinsic base and the upper vertical spacer; and replacing the lower vertical spacer with a metal sensing surface, wherein a portion of a sidewall of the first sample trench is provided by the metal sensing surface, wherein the first sample trench extends through the sensor device.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:

a sensor device including bipolar junction transistors that have a vertical configuration with a small footprint area (e.g., of a single sensor);

a sensor device including bipolar junction transistors that have a vertical configuration and improved wiring flexibility;

a sensor device configured to enable a test sample (e.g., a liquid) to pass through the sensor device by gravity, with no pumping needed (i.e., gravity induced flow of the test sample, without the aid of a pump);

a sensor device having a sensing trench having an opening sized to provide a filtration function;

in a sensor device including a vertically stacked cascode bipolar junction transistor pair, a dual-base/dual-sensing surface bipolar junction transistor device without an electrical contact to its base.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings:

FIGS. 6-17 are cross-section views of a dual-base bipolar junction transistor sensing device at different steps in a manufacturing process according to one or more embodiments of the present invention;

DETAILED DESCRIPTION

Figure 1:
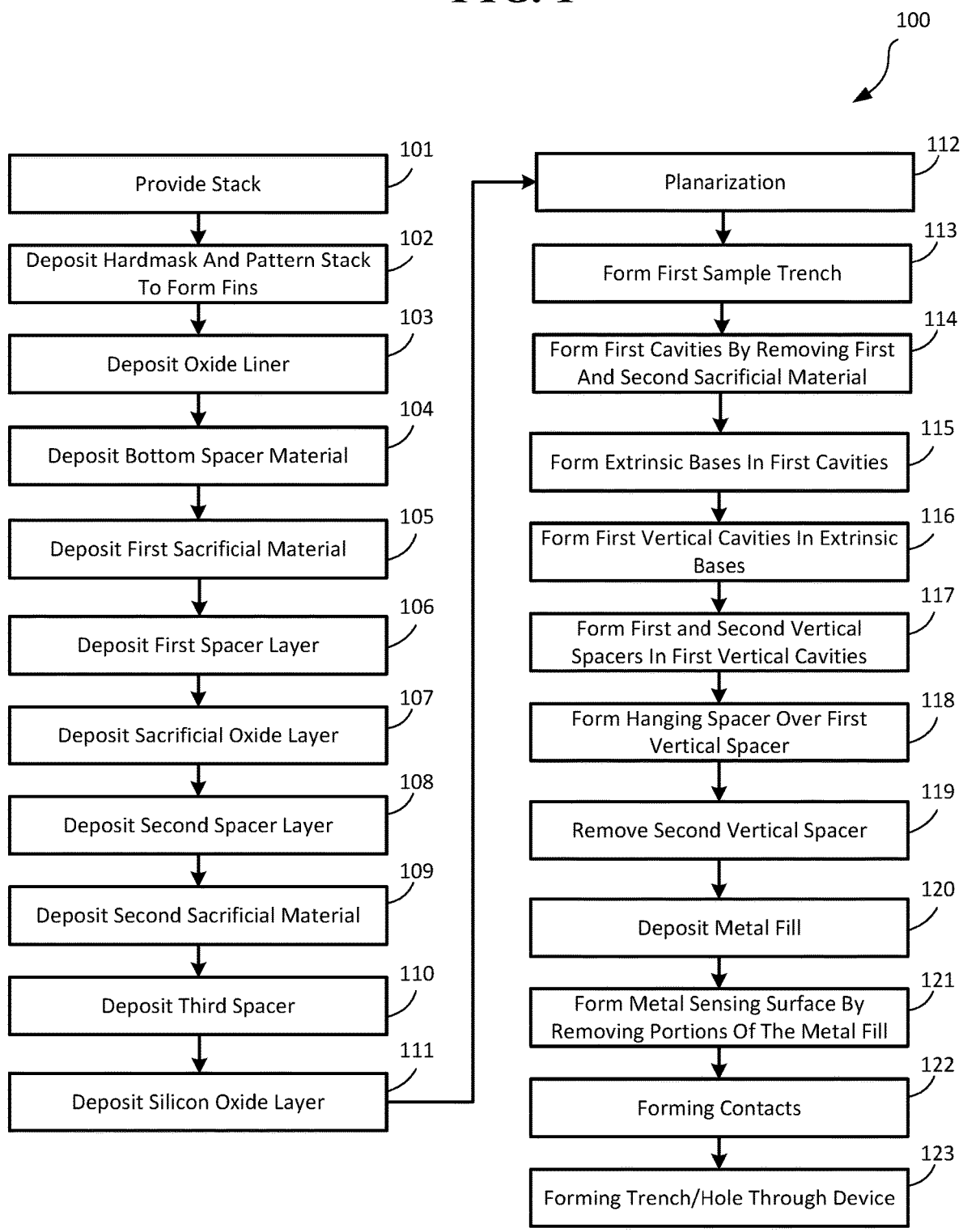
FIG. 1 illustrates methods of forming a bipolar junction transistor sensing device according to one or more embodiments of the present invention.

According to embodiments of the present invention, a sensor device (e.g., a biosensing device) includes a vertically stacked cascode bipolar junction transistor pair, which enables efficient integration of a dual-base bipolar junction transistor sensor and high-performance sensing. According to one or more embodiments, the sensor device is a vertically stacked cascode bipolar junction transistor pair including a sensing surface, the sensor device being configured for gravity induced flow of a sample (e.g., a liquid) past the sensing surface.

It should be understood that a cascode pair refers to a cascode amplifier including a common-emitter stage followed by a common-base stage. The cascode configuration can improve (as compared to a single-stage amplifier) an output resistance ($r_o$) by up to about (1+β) times and a voltage gain by up to about β times, where β is the current gain (ratio of the collector current to the base current) of the bipolar junction transistor.

A cascode amplifier's output resistance can be written as:

$$R_{out}(\text{bipolar cascode}) = g_{o1} + g_{o2} + g_{\pi1} + g_{m1}/g_{o1}(g_{o2} + g_{\pi1})$$

where $g_o = 1/r_o$, $g_\pi = 1/r_\pi$, $r_\pi = \beta/g_m$, $g_m$ is the transconductance of the bipolar junction transistor, and the subscripts "1" and "2" refer to the common-base and common-emitter stages, respectively. Assuming $r_o \gg r_\pi$, the output resistance can be approximated as:

$$R_{out}(\text{bipolar cascode}) \approx (\beta_1 + 1) r_{o1}$$

A cascode amplifier's intrinsic (self) gain, i.e. voltage gain when the load is infinitely large, can be written as:

$$A_V(\text{bipolar cascode}) = g_{m2}(g_{o1} + g_{m1})/g_{o1}(g_{o2} + g_{\pi1}) \approx -g_{m2}\beta_1 r_{o1} \text{ (for } r_o \gg r_\pi\text{)}.$$

As such, the output resistance of a bipolar cascode amplifier (approximately $(\beta+1)r_o$) can be improved by a factor of approximately β+1 compared to the output resistance $r_o$ of a single-stage bipolar transistor amplifier, and the self-gain (i.e. upper limit to voltage gain) of a bipolar cascode amplifier (approximately $-g_m\beta r_o$) can be improved by a factor of approximately β compared to the self-gain $-g_m r_o$ of a single-stage bipolar transistor amplifier. The features and advantages of a cascode amplifier such as the ones briefly described here are well-known.

According to some aspects, a dual-base bipolar junction transistor sensor/vertical bipolar junction transistor pair forms a cascode sensor-amplifier pair for in-situ amplification of the biological signals acquired by the dual-base bipolar junction transistors sensor.

According to some embodiments, a dual-base bipolar junction transistor sensor/vertical bipolar junction transistor pair forms a cascode pair where the output resistance of the dual base bipolar junction transistor sensor is enhanced by a factor approximately equal to the current gain (β) of the vertical bipolar junction transistor. As a result, the amplifier gain may be enhanced by up to β times.

According to some embodiments, a dual-base bipolar junction transistor sensor is integrated vertically on a vertical bipolar junction transistor with little or no increase in the overall device footprint (e.g., less than about 10%). Since both the dual-base bipolar junction transistor and the vertical bipolar junction transistor of the cascode pair are vertical transistors with small footprints, a sensor device according to embodiments of the present invention can enable dense and area-efficient systems.

According to some aspects, low noise (i.e., spontaneous fluctuations in current or in voltage) can be achieved for III-V based bipolar junction transistors using, for example, an indium phosphide (InP) emitter (wider bandgaps are associated with lower noise), and for group IV based bipolar junction transistors using, for example, a Si—SiGe—Si structure.

According to some embodiments, a vertical sensor senses a liquid running vertically through a trench/hole/vertical opening (in contrast to conventional laterally/horizontally configured devices) of a sensor device by gravity, without a pumping element. According to one or more embodiments, gravity feed sensor devices can have a size filtration effect taking advantage of a size of the trench/hole/vertical opening blocking relatively large compounds, and low power requirement due to the elimination of the pump (e.g., micropump). For example, a trench width can be designed for size selection of a biomolecule of interest, e.g., about 5 micrometers (um) for cancer cells, larger than about 100 nanometers (nm) for large proteins, or configured when deoxyribonucleic acid (DNA) sensing is desired (it should be understood that DNA typically has a width of about 2.5 nm and a length depending on various factors (e.g., species, whether cutting has been used, etc.).

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Referring to FIG. 1, according to some aspects, a method 100 of manufacturing a dual-base bipolar junction transistor sensor device includes providing a stack at step 101, the stack including a substrate, an isolation layer, an emitter layer, a first base layer, a collector-emitter layer, a second base layer, a collector layer, and a resistor layer. According to at least one aspect, the method 100 includes depositing and patterning a hardmask to form a mask, and patterning the stack using the mask at step 102 to form a plurality of fins. According to some embodiments, the method 100 includes sequentially forming/depositing an oxide liner at step 103, a bottom spacer material at step 104, a first sacrificial material at step 105, a first spacer layer at step 106, a sacrificial oxide layer at step 107, a second spacer layer at step 108, a second sacrificial material at step 109, a third spacer layer at step 110, and a silicon oxide layer at step 111. According to at least one embodiment, one or more of step 107 and step 108 can be omitted. According to one or more embodiments, the device can be planarized (e.g., by chemical mechanical polishing (OH)) at step 112. According to some aspects, the method 100 includes forming a first sample trench between the fins at step 113 by patterning the first sacrificial material, the first spacer layer, the sacrificial oxide layer, the second spacer layer, the second sacrificial material, the third spacer layer, and the silicon oxide layer. According to some aspects, the method 100 includes forming first cavities by removing the first sacrificial material and the second sacrificial material at step 114, where the first cavities expose the oxide liner on the sidewalls of the fins. According to some aspects, the method 100 includes forming a plurality of extrinsic bases at step 115 in the first cavities and forming vertical cavities in the extrinsic bases at step 116. According to one or more embodiments, the method 100 includes forming vertical spacers at step 117 in the vertical cavities, forming a hanging spacer at step 118, which protects an upper extrinsic base and an upper vertical spacer, and removing a lower vertical spacer at step 119. According to one or more embodiments, the method 100 includes filling the sample trench with a metal fill at step 120 According to some embodiments, step 120 can further include a planarization (e.g., by OH). According to one or more embodiments, the method 100 includes forming metal sensing surfaces at step 121 by removing portions of the metal fill, forming metal contacts at step 122, and forming a trench/hole at step 123 through the device, which allows a sample to pass through the device.

Figure 2:
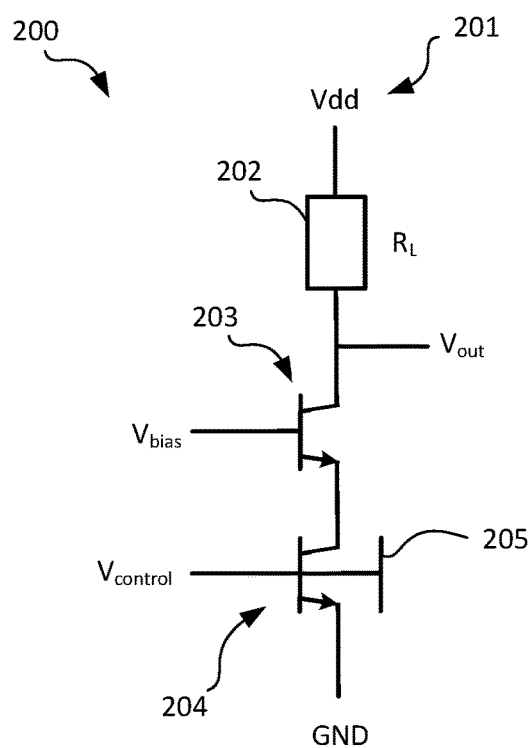
FIG. 2 is a circuit diagram of a first dual-base bipolar junction transistor sensing device according to one or more embodiments of the present invention.

Referring to FIG. 2, according to some aspects, a dual-base bipolar junction transistor sensor device 200 includes a voltage supply 201, a resistor 202 (load resistor $R_L$) receiving the voltage supply 201 and connected to an NPN bipolar junction transistor 203, and a first dual-base NPN bipolar junction transistor 204 with a sensing surface 205 connected to a first base of the first dual-base NPN bipolar junction transistor 204. The first base of the first dual-base NPN bipolar junction transistor 204 may be referred to as a sensing base, and the first dual-base NPN bipolar junction transistor 204 may be referred to as a biosensing transistor.

According to some embodiments, the sensor device 200 further includes a first contact for an output voltage $V_{out}$, a second contact applying a bias voltage $V_{bias}$ to a base of the NPN bipolar junction transistor 203, and a third contact applying a control voltage $V_{control}$ to a second base of the first dual-base NPN bipolar junction transistor 204. The second base of the first dual-base NPN bipolar junction transistor 204 may be referred to as a control base.

According to at least one embodiment, an emitter of the NPN bipolar junction transistor 203 is connected to a collector of the first dual-base NPN bipolar junction transistor 204, an emitter of the first dual-base NPN bipolar junction transistor 204 is connected to a ground (GND). The NPN bipolar junction transistor 203 forms a common-base stage and the first dual-base NPN bipolar junction transistor 204 forms a common-emitter stage. The sensor device 200 is therefore configured as a cascode amplifier.

According to one or more embodiments, the first dual-base NPN bipolar junction transistor 204 has an inherent voltage gain associated with a bipolar junction transistor. According to some embodiments, the cascode configuration of FIG. 2 boosts the voltage gain by increasing the effective output resistance. As a result, the effective voltage gain can be increased by up to β times, where β is the current gain of the NPN bipolar junction transistor 203.

It should be noted that, as an ion-sensitive transistor, the first dual-base NPN bipolar junction transistor 204 can be used for sensing organic or inorganic compounds (test samples), as well as characteristics of test compounds such as pH (e.g., by sensing hydrogen ion concentrations).

Figure 3:
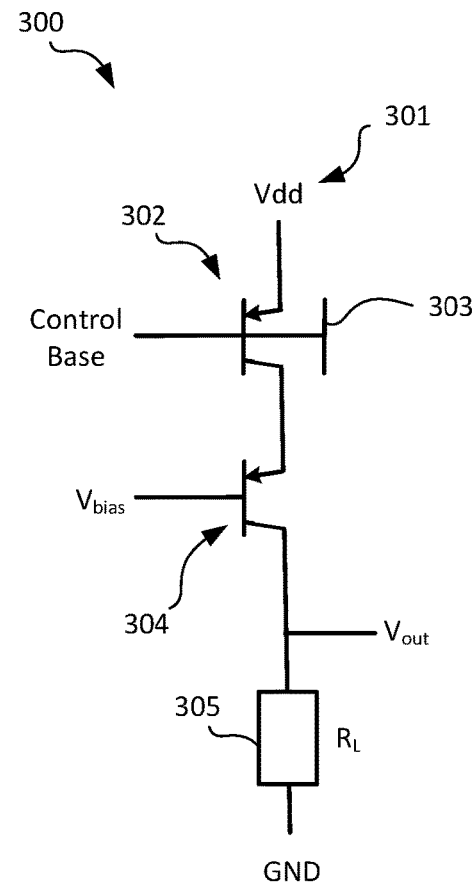
FIG. 3 illustrates methods of forming a bipolar junction transistor device sensing according to one or more embodiments of the present invention.

Referring to FIG. 3, according to some aspects, a second dual-base bipolar junction transistor sensor 300 includes a second voltage supply 301 connected to a second dual-base PNP bipolar junction transistor 302 having a second sensing surface 303. According to at least one embodiment, the second dual-base bipolar junction transistor sensor 300 includes the second dual-base PNP bipolar junction transistor 302 is connected to a PNP bipolar junction transistor 304. According to some aspects, a fourth contact for the output voltage $V_{out}$ is connected to the PNP bipolar junction transistor 304 and a second resistor 305 $R_L$ is connected to the ground.

According to some embodiments, the second dual-base bipolar junction transistor sensor 300 further includes a fifth contact for applying the control voltage $V_{control}$ to the control base of the second dual-base PNP bipolar junction transistor 302, a sixth contact applying a bias voltage $V_{bias}$ to a base of the PNP bipolar junction transistor 304.

According to at least one embodiment, the second voltage supply 301 is applied to an emitter of the second dual-base PNP bipolar junction transistor 302. According to some aspects, a collector of the second dual-base PNP bipolar junction transistor 302 is connected to an emitter of the PNP bipolar junction transistor 304, and a collector of the PNP bipolar junction transistor 304 is connected to the fourth contact for the output voltage $V_{out}$ and the second resistor 305. The PNP bipolar junction transistor 304 and the dual-base PNP bipolar junction transistor 302 form common-base and common-emitter stages, respectively; thus, forming a cascode amplifier.

Figure 4:
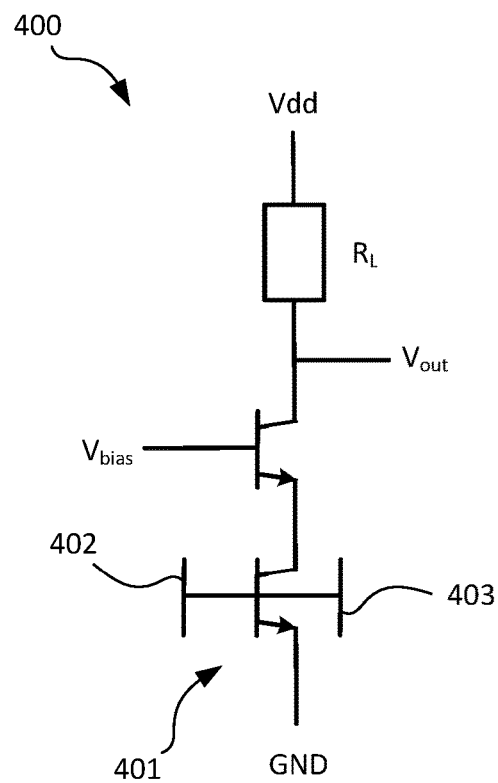
FIG. 4 is a circuit diagram of a first dual-base bipolar junction transistor sensing device according to one or more embodiments of the present invention.

According to one or more embodiments and referring to FIG. 4, in a third dual-base bipolar junction transistor sensor 400, a third dual-base NPN bipolar junction transistor 401 includes a third sensing surface 402 on a first sensing base, and a fourth sensing surface 403 on a second sensing base of the third dual-base NPN bipolar junction transistor 401.

Figure 5:
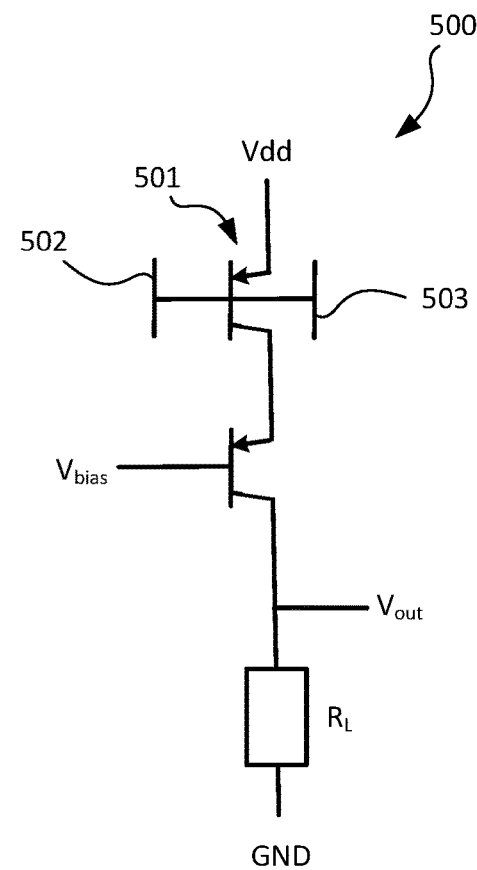
FIG. 5 is a circuit diagram of a second dual-base bipolar junction transistor sensing device according to one or more embodiments of the present invention.

According to one or more embodiments and referring to FIG. 5, in a fourth dual-base bipolar junction transistor sensor 500, a fourth dual-base PNP bipolar junction transistor 501 includes a fifth sensing surface 502 on a first sensing base, and a sixth sensing surface 503 on a second sensing base of the dual-base PNP bipolar junction transistor 302.

According to one or more embodiments, the dual-surface or base-all-around sensors increase the sensitivity of the sensor because the overall area of the available sensing surface is increased. For example, if the control base of dual-base bipolar junction transistor is replaced with a sensing base (as illustrated in FIG. 4 and FIG. 5), assuming that the two sensing surfaces have the same area, the overall sensing area is doubled.

FIGS. 6-17 are cross-section views of a dual-base biosensing bipolar junction transistor device at different steps in a manufacturing process according to one or more embodiments of the present invention.

Figure 6:
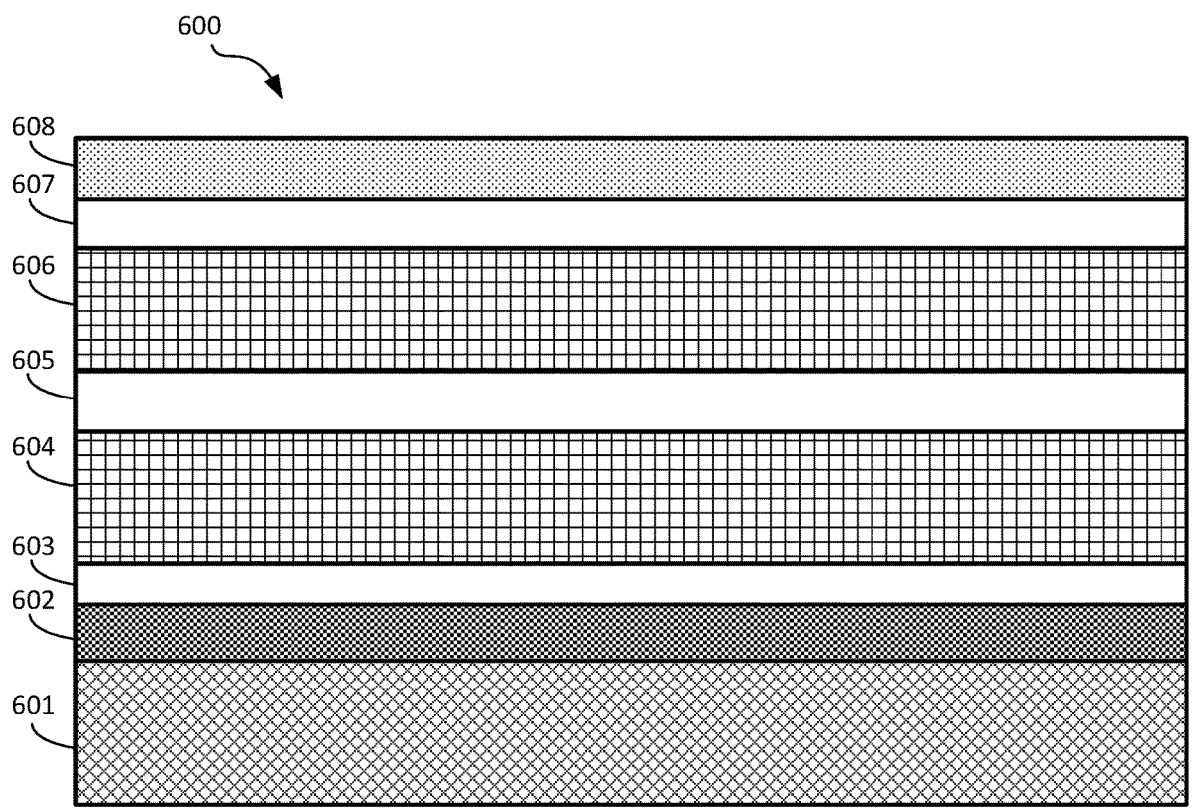

Referring to FIG. 6, according to some aspects, a stack 600 is prepared using a substrate 601 and sequentially forming (e.g., depositing) an isolation layer 602 (e.g., a punch through stopper PTS), an emitter layer 603, a first base layer 604, a collector-emitter layer 605, a second base layer 606, a collector layer 607, and a resistor layer 608.

It should be understood that layer thicknesses may not be draw to scale, and are for illustrative purposes only.

According to some embodiments, the emitter layer 603, the first base layer 604, the collector-emitter layer 605, the second base layer 606, the collector layer 607, and the resistor layer 608 can be formed by epitaxy. Exemplary doped extrinsic base materials forming the first base layer 604 and the second base layer 606 in some embodiments include silicon (Si), silicon germanium (SiGe), and germanium (Ge). Doped poly-Si, poly-SiGe, doped poly-Ge and doped III-V compound semiconductor materials are among the materials that may alternatively be employed for the doped extrinsic base materials of the exemplary structure.

Figure 7:
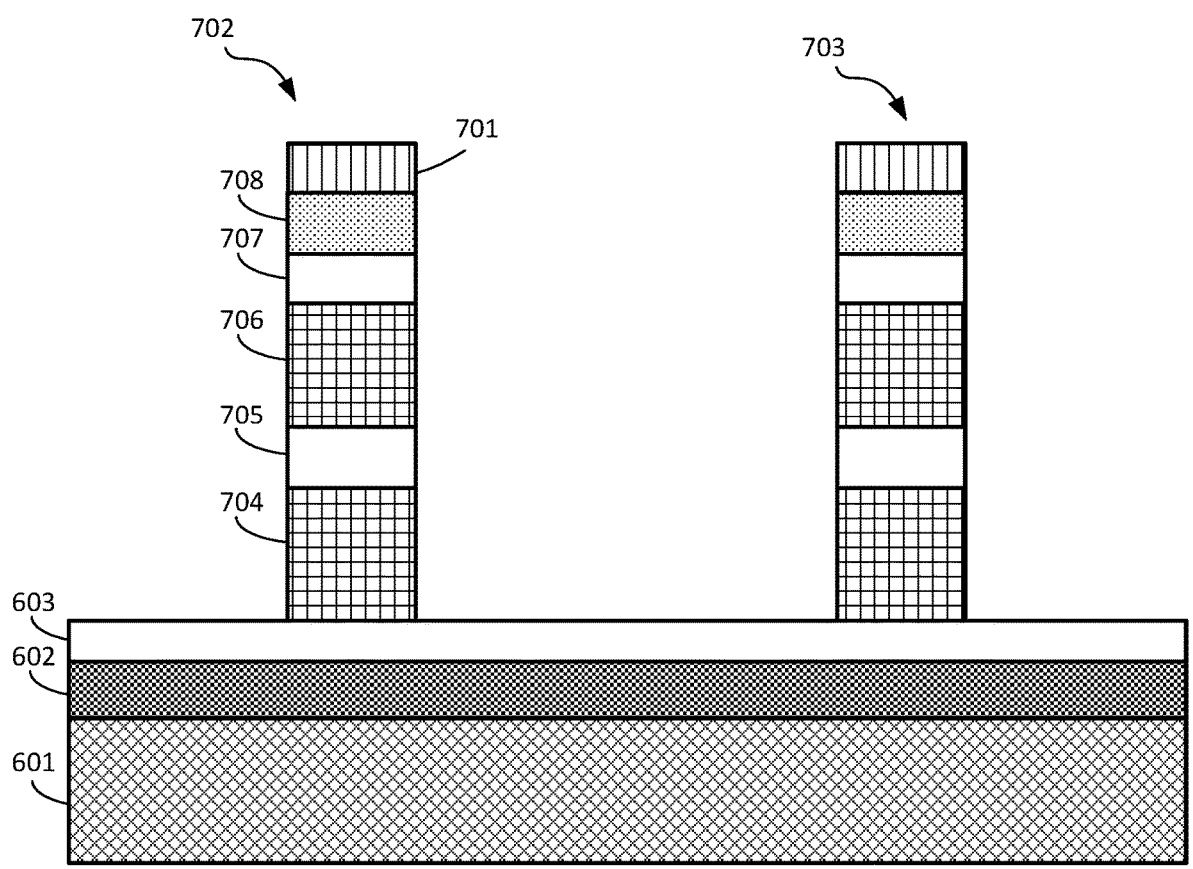

Referring to FIG. 7, according to some aspects, a hardmask (not shown) is deposited and patterned to form a mask 701, wherein the mask 701 is used to pattern the stack 600 and form a first fin 702 and a second fin 703. Each of the first fin 702 and the second fin 703 include a first base 704, a collector-emitter 705, a second base 706, a collector 707, a resistor 708, and the mask 701.

According to some embodiments, the hardmask can be formed of a silicon nitride (e.g., $Si_xN_y$).

Referring to FIG. 8, according to some aspects, a plurality of layers are sequentially formed/deposited, including an oxide liner 801, a bottom spacer material 802, a first sacrificial material 803, a first spacer layer 804, a sacrificial oxide layer 805, a second spacer layer 806, a second sacrificial material 807, a third spacer layer 808, and a silicon oxide layer 809, which may be planarized (e.g., by CMP). According to some aspects, the third spacer layer 808 and the silicon oxide layer 809 may have a thickness that is sufficiently thin such that a CMP is not needed/cannot be used. According to some aspects, the oxide liner 801 is a 2 nm silicon oxide formed by conformal deposition or by conformal deposition followed by low-temperature oxidation.

The spacer layers can be deposited using directional deposition techniques including, but not limited to high density plasma (HDP) deposition and gas cluster ion beam (GCIB) deposition, or deposition techniques including, but not limited to, CVD, PECVD, radio-frequency CVD (RFCVD), PVD, atomic layer deposition (ALD), molecular layer deposition (MLD), molecular beam deposition (MBD), pulsed laser deposition (PLD), liquid source misted chemical deposition (LSMCD), and/or sputtering.

According to at least one embodiment, the oxide liner 801 is an integration/sidewall protection layer for the first fin 702 and the second fin 703. According to at least one embodiment, the bottom spacer material 802 can be formed of SiN, SiBCN, SiBN, SiOCN, etc., formed by a directional deposition.

According to at least one embodiment, the first sacrificial material 803 and the second sacrificial material 807 may be formed of an amorphous silicon (a-Si) or a polycrystalline silicon (poly-silicon) that can be etched selectively to the spacer material. Sacrificial layer material may be deposited by a deposition process such as, but not limited to, PVD, CVD, PECVD, inductively coupled plasma chemical vapor deposition (ICP CVD), or any combination thereof. Hydrogenated amorphous silicon is typically deposited by PECVD, although other techniques such as hot-wire chemical vapor deposition (HWCVD) may be used.

According to some aspects, the first spacer layer 804, the sacrificial oxide layer 805, the second spacer layer 806 are deposited by directional deposition, with the sacrificial oxide layer 805 between the first spacer layer 804 and the second spacer layer 806. According to at least one embodiment, the sacrificial oxide layer 805 and the second spacer layer 806 can be omitted, wherein the first spacer layer 804 has a thickness about the same as the collector-emitter 705.

According to some embodiments, surfaces that form a p-n junction may be passivated, for example, surfaces between the first base layer 604 and the collector-emitter layer 605 and/or between the collector-emitter layer 605 and the second base layer 606. These surfaces may be passivated by applying a passivation layer (e.g., an oxide liner deposited on the first base layer 604 and/or on the collector-emitter layer 605). According to some aspects, such a structure reduces or eliminates a direct leakage path between a p+ doped extrinsic base and an n+ collector-emitter such as the collector-emitter 705, since the height of the collector-emitter may be reduced by a thickness of the passivation layer(s) (see for example, first passivation layer 811 and second passivation layer 812 in view 810, FIG. 8).

According to at least one embodiment, the third spacer layer 808, and the silicon oxide layer 809 are deposited by directional deposition. According to some aspects, the third spacer layer 808 is formed of SiN, SiBCN, SiCN, SiOCN, etc.

Non-limiting examples of materials for the silicon oxide layer 809 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The silicon oxide layer 809 has a thickness in a range from about one hundred to one thousand nanometers in some embodiments, though such a thickness range is not considered critical.

Figure 9:
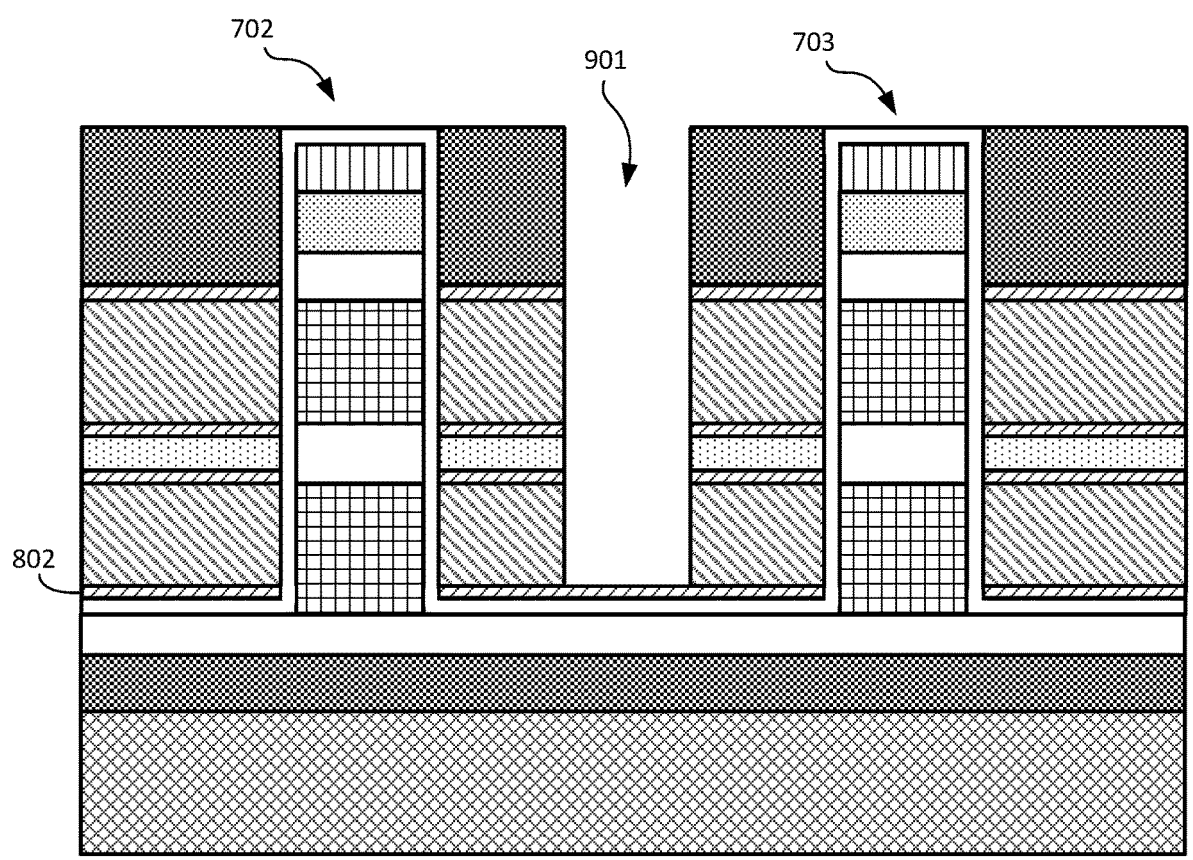

Referring to FIG. 9, according to some aspects, a first intermediate device 800 (see FIG. 8) is patterned to form a first sample trench 901 between the first fin 702 and the second fin 703, which exposes the bottom spacer material 802. According to some embodiments, the first sample trench 901 can be formed by reactive ion etch, such that the first sample trench 901 includes substantially vertical sidewalls. A patterned mask (not shown) having an opening corresponding to the trench location is formed on the top surface of the silicon oxide layer 809 prior to etching the oxide material and the underlying layers. The mask protects the remainder of the structure.

Figure 10:
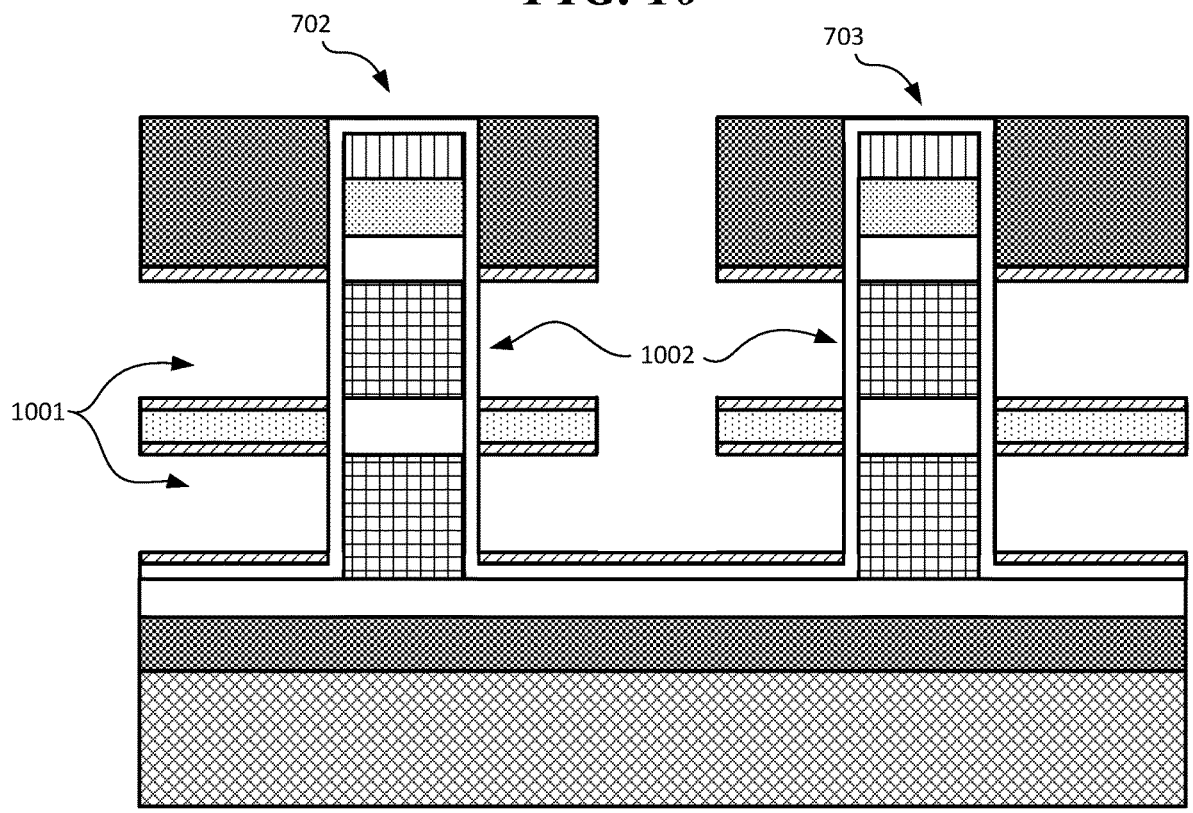

Referring to FIG. 10, according to some aspects, the first sacrificial material 803 and the second sacrificial material 807 are removed by etching the amorphous silicon, creating cavities, e.g., first cavities 1001, exposing the oxide liner, e.g., oxide liner portions 1002, on the sidewalls of the first fin 702 and the second fin 703.

Figure 11:
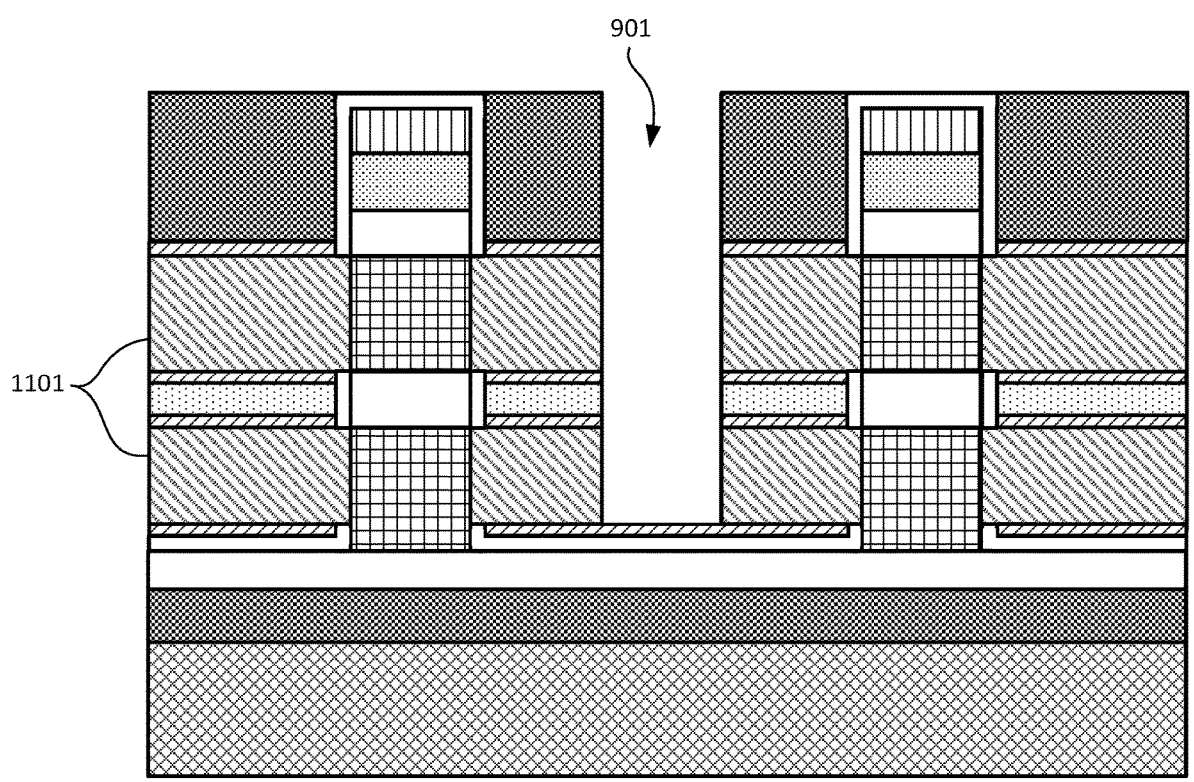

Referring to FIG. 11, according to some aspects, a plurality of extrinsic bases, e.g., extrinsic bases 1101, are formed in the cavities. According to some embodiments, the extrinsic bases are grown by epitaxy, e.g., by lateral epitaxial growth. According to at least one embodiment, the extrinsic bases 1101 are formed of a large grain poly-crystalline epitaxial material, which is a selectively epitaxially grown. Such large grain poly-crystalline epitaxy may include dislocations and stacking faults. According to one or more embodiments, any lateral overgrowth (not shown) can be removed by a reactive ion etch, for example, to clear (e.g., clean and straighten sidewall) the sample trench 901.

Figure 12:
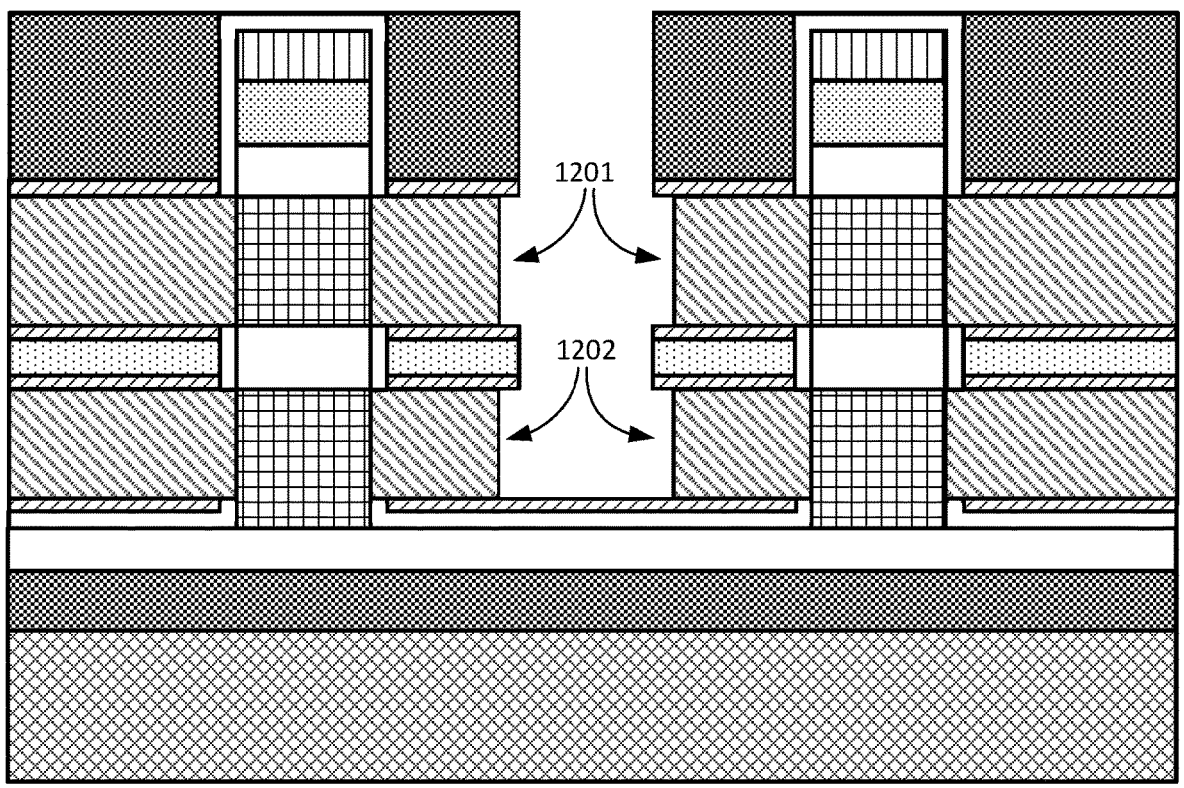

Referring to FIG. 12, according to some aspects, a lateral etch of exposed portions of the extrinsic bases (e.g., by wet etch, or gaseous etch) creates first vertical cavities 1201 and second vertical cavities 1202.

Figure 13:
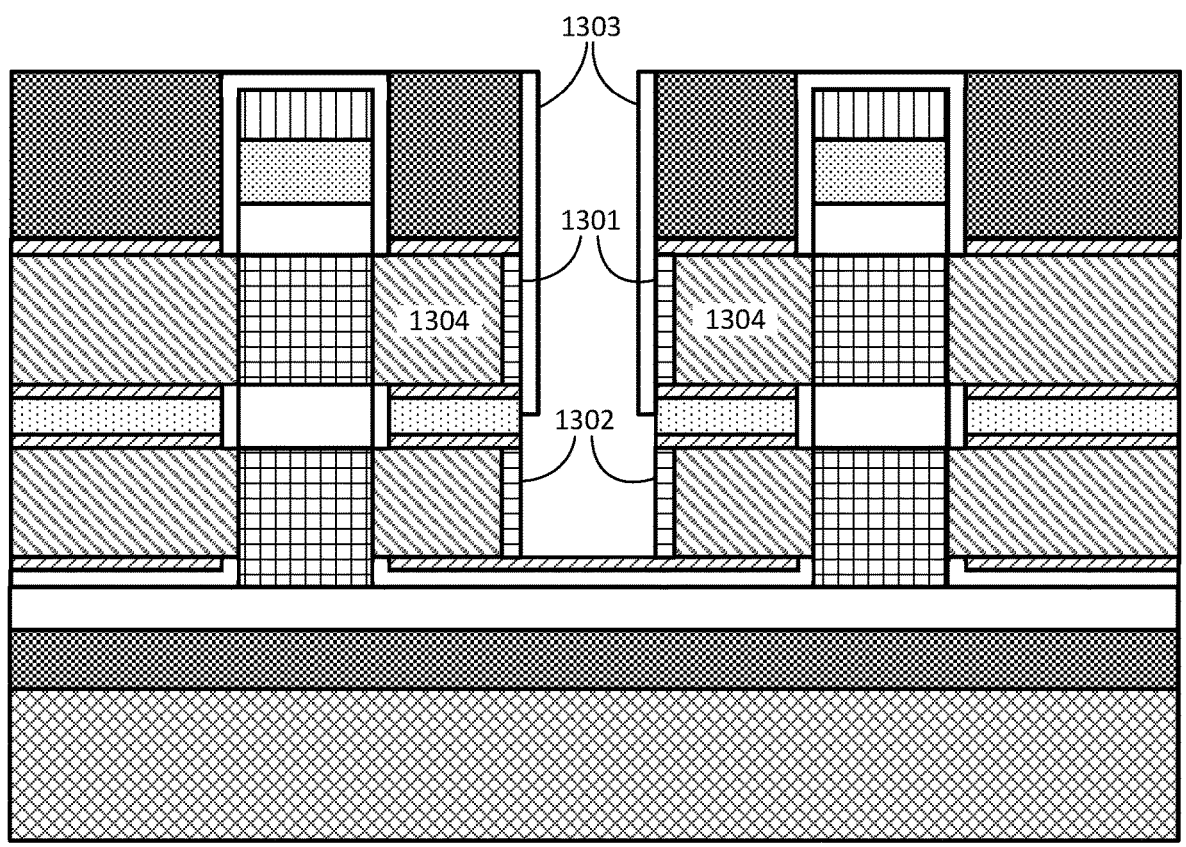

Referring to FIG. 13, according to some aspects, the first vertical cavities 1201 and the second vertical cavities 1202 are filled with a dielectric material forming a first vertical spacer 1301 and a second vertical spacer 1302. The dielectric material can be deposited using one or more of a variety of existing methods. According to at least one embodiment, a hanging spacer 1303 is formed, which protects an upper extrinsic base 1304 and the first vertical spacer 1301.

Figure 14:
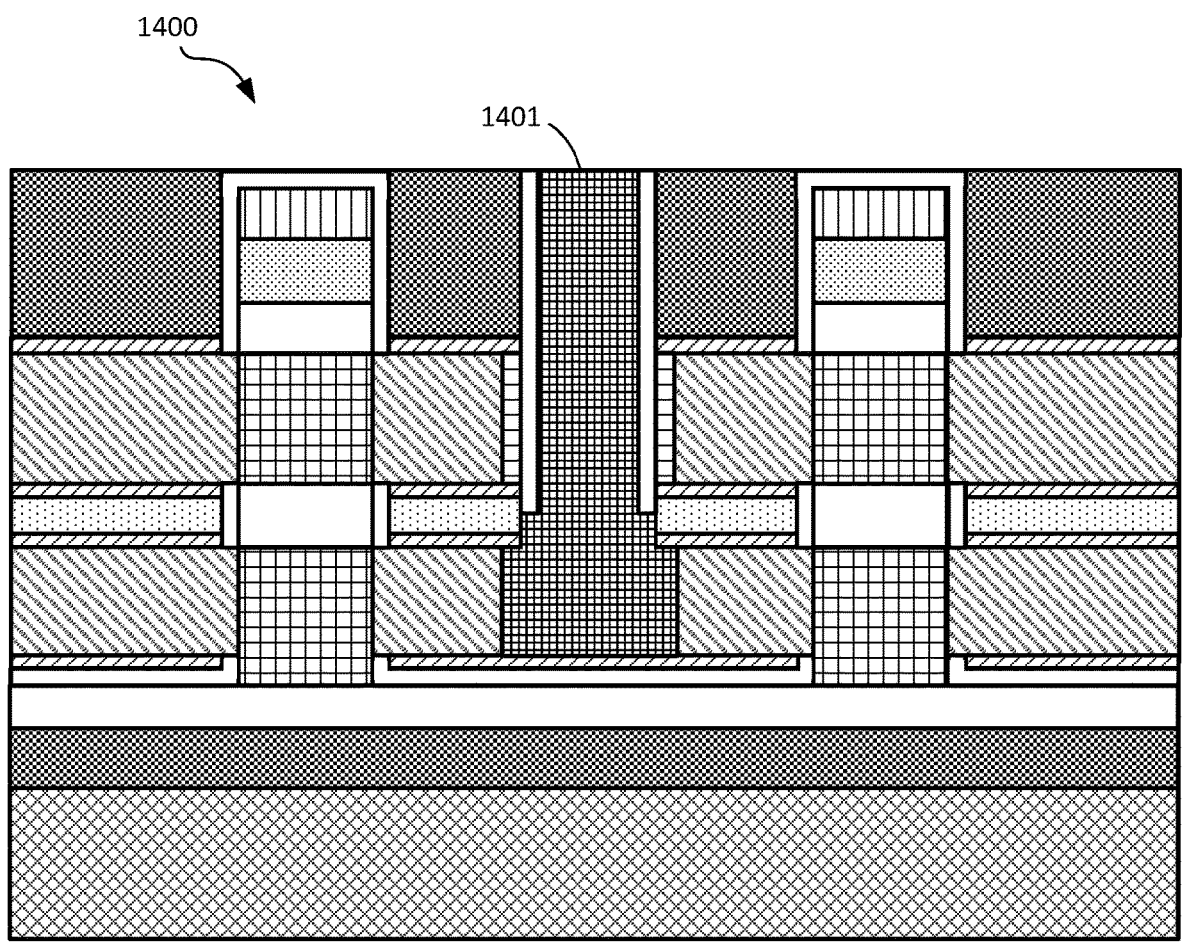

Referring to FIG. 14, according to some aspects, the sample trench is filled with a metal fill 1401 (e.g., TiN) and a second intermedia device 1400 is planarized (e.g., by CMP). According to some embodiments, the metal fill 1401 can be formed by a first deposition with an atomic layer deposition (ALD) followed by a metal deposition fill.

Figure 15:
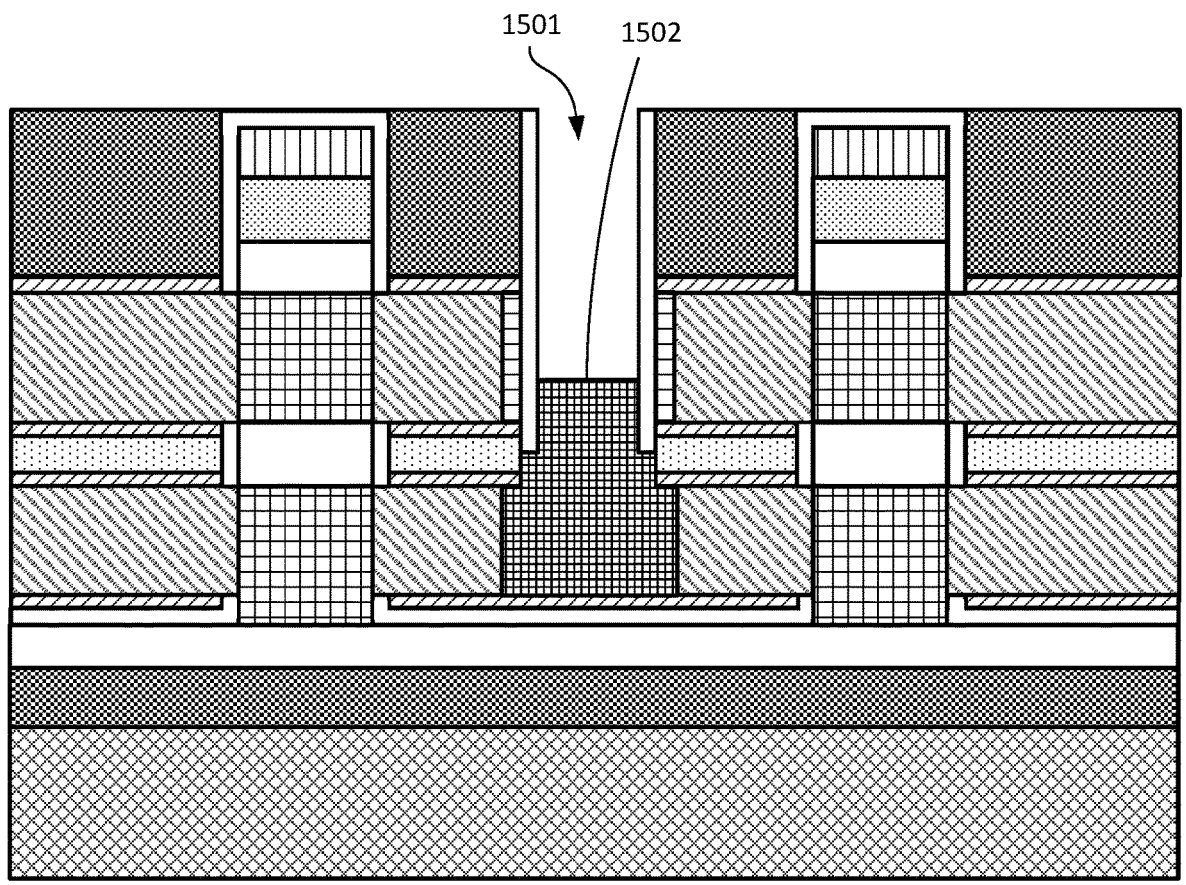

Referring to FIG. 15, according to some aspects, a top portion of the metal fill is removed, e.g., by a wet etch, forming an intermedia trench 1501 and exposing a lower metal portion 1502.

FIG. 15 depicts recessing a portion of the metal fill 1401 that is present within the sample trench 901. In some embodiments, the metal fill 1401 is first recessed with an isotropic wet etch. For example, when the metal fill 1401 is composed of titanium nitride (TiN), the etch process for recessing the titanium nitride may be an isotropic wet etch that is, e.g., Cl-based, or $H_2O_2/NH_4OH$-based. The height of a top of the recessed metal (i.e., lower metal portion 1502) is equal to or greater than a height that corresponds to the lowest portion of the hanging spacer 1303. It is noted that the above etch composition provides only one example of an etch process that may be employed at this stage of the process flow, and that other compositions are equally applicable. For example, etch composition for etching gold (Au) or silver chloride (AgCl) may be employed when a metal sensing surface 1601 (see FIG. 16) being formed is composed of gold (Au) or silver chloride (AgCl).

Figure 16:
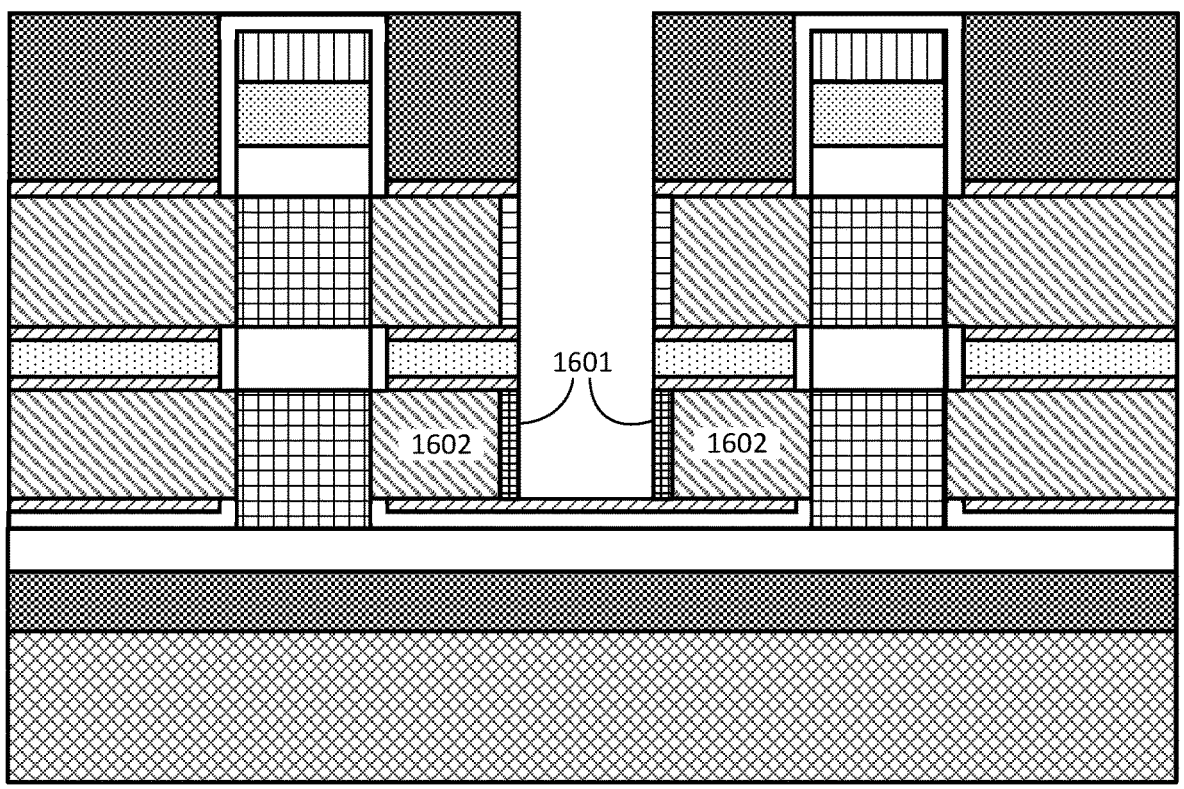

Referring to FIG. 16, according to some aspects, a portion of the lower metal portion 1502 is removed, e.g., by a directional reactive ion etch, to form the metal sensing surface 1601 on lower extrinsic bases 1602 below the first vertical spacer 1301. According to one or more embodiments, the metal sensing surface 1601 can have an irregular shape, e.g., a concave surface exposed to the trench.

According to some aspects, the metal sensing surface 1601 extends along an entire height of the lower extrinsic bases 1602. The composition of the metal sensing surface 1601 may be selected for the application of the sensor. For example, in one embodiment, the sensing element is a titanium nitride (TiN) layer, in which the metal sensing surface 1601 is for sensing pH of a sample within a trench/hole 1707 (see FIG. 17). In another example, the metal sensing surface 1601 is composed of a silver chloride (AgCl) layer, in which the metal sensing surface 1601 is for sensing chloride (Cl) content of a sample within the trench/hole 1707 (see FIG. 17). In yet another example, the metal sensing surface 1601 is composed of gold (Au). A sensing element that is provided by a gold (Au) layer may be used for sensing deoxyribonucleic acid (DNA), as well as proteins using this chemistry.

FIG. 16 depicts applying an anisotropic etch process to the lower metal portion 1502 that is present within the sample trench 901. The anisotropic etch process removes a majority of the metal, while a remainder of the metal is present in a region of the second vertical cavities 1202 to provide the metal sensing surface 1601 of the bipolar junction transistor sensor. As used herein, an "anisotropic etch process' denotes a material removal process in which the etch rate in the direction normal to the surface to be etched is greater than in the direction parallel to the surface to be etched. In one embodiment, the anisotropic etch process removes all the lower metal portion 1502 that is present within the sample trench 901 except for the portion within the region of the second vertical cavities 1202 that is protected by overlying portions. Because of the anisotropic nature of the etch process, the remaining portion of the metal present in the region of the second vertical cavities 1202 that provides the metal sensing surface 1601 and provides a sidewall that is aligned with a sidewall of the sample trench 901 provided by the overlying portions.

In some embodiments, the anisotropic etch that is employed at this stage of the process flow includes reactive ion etching. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface.

In some embodiments, when the lower metal portion 1502 is composed of titanium nitride, the reactive ion etch process may employ Cl-based etch chemistries, such as $Ar/Cl_2$, or $Xe/Cl_2$. Other examples of anisotropic etching that can be used at this point of the present invention include ion beam etching, plasma etching or laser ablation.

Figure 17:
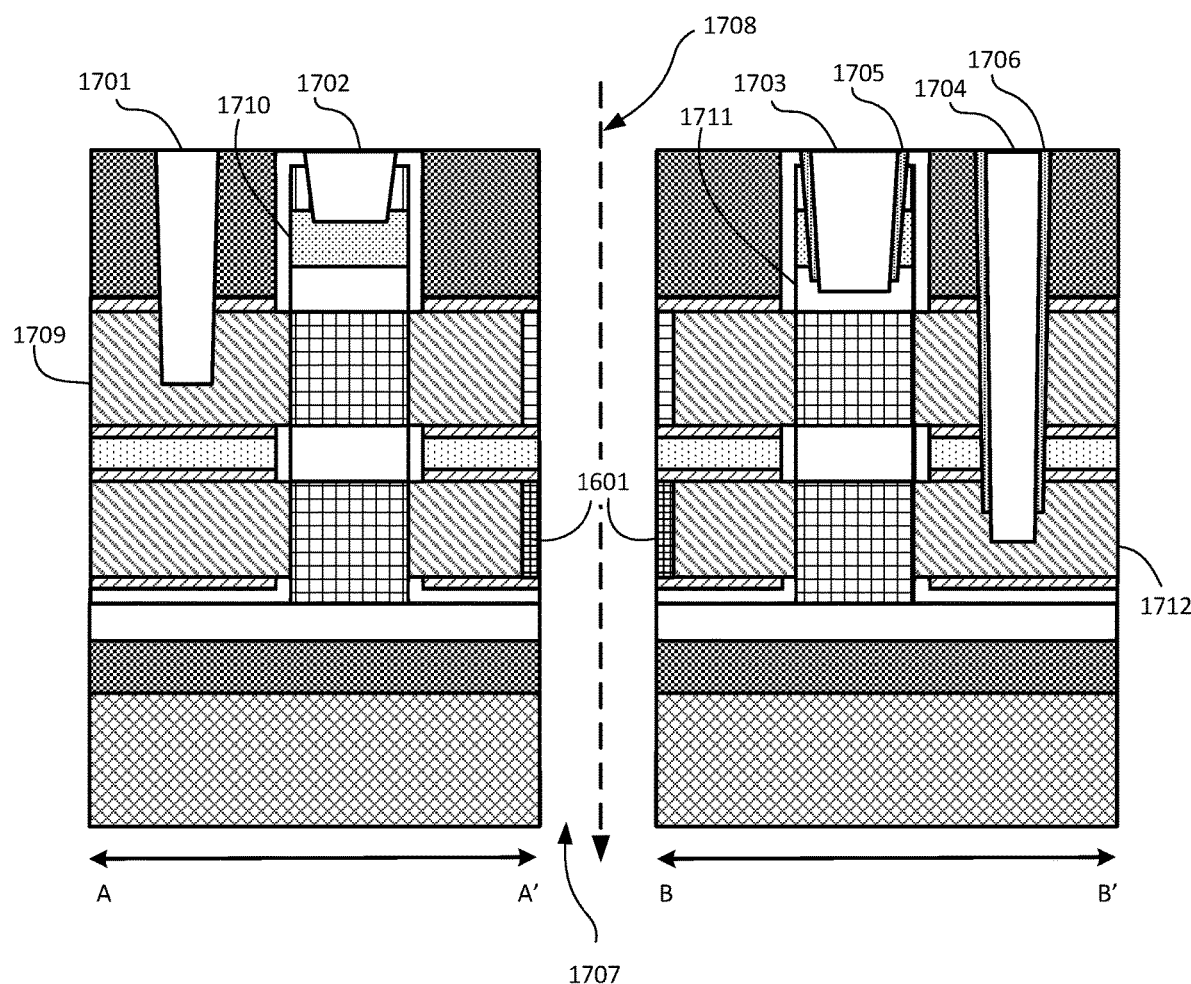
Figure 18:
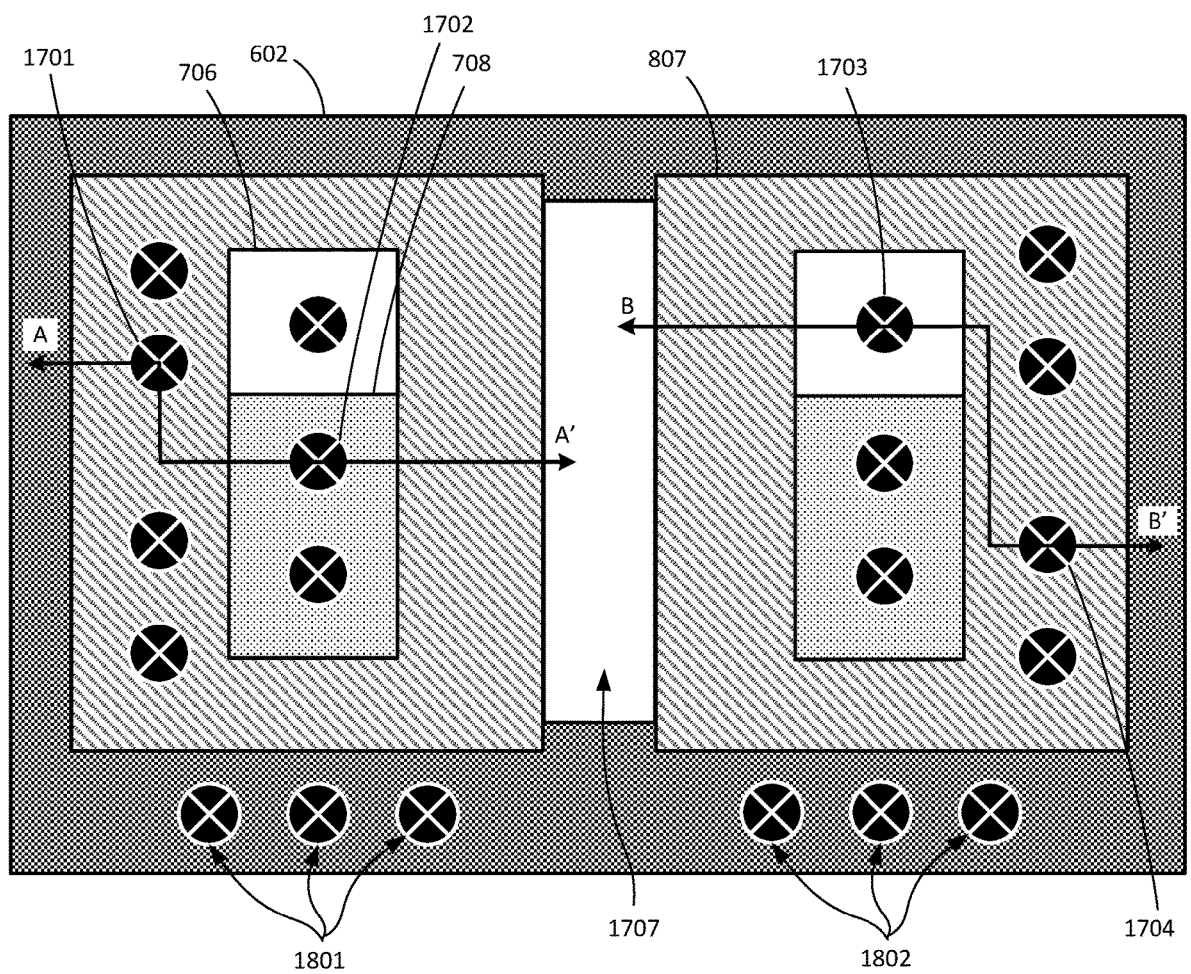
FIG. 18 is a top-down view of a dual-base bipolar junction transistor sensing device according to one or more embodiments of the present invention.

Referring to FIGS. 17 and 18, according to some aspects, various contacts can be formed. According to some embodiments, the contacts include a $V_{bias}$ contact 1701, a $V_{dd}$ contact 1702, a $V_{out}$ contact 1703, a $V_{control}$ contact 1704, first ground contacts 1801, and second ground contacts 1802. According to one or more embodiments, a trench/hole 1707 is extended entirely through the device. According to some embodiments, a liner can be deposited in contact trenches, for example, forming first liners 1705 and second liners 1706. It should be understood that FIG. 17 illustrates cross-sections A-A' and B-B' shown in FIG. 18. For example, the cross-section A-A' shows the $V_{bias}$ contact 1701 to a first upper control base 1709 and the $V_{dd}$ contact 1702 to a first resistor 1710, and the cross-section B-B' shows the $V_{out}$ contact 1703 to a first n+ collector 1711 and the $V_{control}$ contact 1704 to a first lower control base 1712. It should be understood that FIG. 18 is a top-down view of a pair of dual-base bipolar junction transistor sensors, sharing a sensing trench (e.g., trench/hole 1707), according to one or more embodiments of the present invention.

Contact material may, for example, include aluminum (Al), platinum (Pt), gold (Au), tungsten (W), titanium (Ti), palladium (Pd) or any combination thereof. Exemplary processes for depositing contact material include chemical vapor deposition (CVD), plasma enhanced CVD (PECVD), physical vapor deposition (PVD), plating, thermal or e-beam evaporation, or sputtering. A planarization process, for example, CMP, may be performed to remove any electrically conductive material from the top surface of a given layer.

According to some embodiments, as shown in FIG. 17, the trench/hole 1707 enables a flow 1708 of a sample past the metal sensing surface 1601. According to at least one aspect, the flow 1708 is gravity based, without the aid of a pump.

The width of the trench/hole 1707 may be selected to accommodate different samples. For example, the width of the trench/hole 1707 may be as great as 5 um for analyzing cancer cells. In yet other examples, the width of the trench/ hole 1707 may be as great as 100 nm for analyzing large proteins, smaller sizes may be employed for DNA sensing.

FIG. 17 depicts an example sensor device manufactured according to the method of FIG. 1 and including an exemplary single column compound semiconductor bipolar junction transistor pair on a substrate 601. The term "bipolar junction transistor" denotes a semiconductor device formed by two p-n junctions whose function is amplification of an electric current. Bipolar transistors are typically made from three sections of semiconductor material, i.e., alternating p-type and n-type conductivity semiconductor materials, with two resulting p-n junctions. As will be described in greater detail below the bipolar junction transistor devices disclosed herein are vertical bipolar junction transistors (VBJT). The term "vertical" is used to describe a bipolar junction transistor device with a dimension extending from an emitter through a base to a collector with a vertical orientation, that may be perpendicular relative to an upper surface of the substrate 601.

It should be understood that example sensor devices according to embodiments of the present invention may include group IV bipolar junction transistor devices or group III-V bipolar junction transistor devices. Recall that according to some embodiments, the emitter layer 603, the first base layer 604, the collector-emitter layer 605, the second base layer 606, the collector layer 607, and the resistor layer 608 can be formed (e.g., by epitaxy) of these group IV or ground III-V semiconductor materials. Depending on the whether a group IV or group III-V device is to be manufactured, the substrate 601 can be a silicon wafer (i.e., a type IV) or a type III-V semiconductor wafer.

Herein, the term "III-V semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys, including III/V elements. In contrast to type III-V semiconductor materials, "type IV semiconductors" are semiconductor materials including at least one element from Group IVA (i.e., Group 14) of the Periodic Table of Elements.

According to some embodiments and referring again to FIG. 6, each of the emitter layer 603, the first base layer 604, the collector-emitter layer 605, the second base layer 606, and the collector layer 607 may be composed of a semiconductor material, such as a type III-V semiconductor material, e.g., indium gallium arsenide (InGaAs) or indium gallium aluminum arsenide (InGaAlAs) or Indium phosphide (InP). According to some aspects, materials having wide bandgaps are associated with low noise, and therefore a low noise device can be achieved with III-V based bipolar junction transistors using, for example, an InP emitter, and with group IV based bipolar junction transistors using, for example, a Si—SiGe—Si structure.

According to some embodiments and referring again to FIG. 6, each of the emitter layer 603, the first base layer 604, the collector-emitter layer 605, the second base layer 606, and the collector layer 607 may be composed of a semiconductor material, such as a type IV semiconductor material, such as silicon, silicon germanium, or Germanium.

According to some embodiments, the emitter layer 603, the collector-emitter layer 605, and the collector layer 607 have a dopant conductivity, e.g., n-type that is opposite the conductivity type of the first base layer 604 and the second base layer 606, e.g., p-type. In one example, the collector layer 607 is composed of large grain polycrystalline silicon having a n-type conductivity, the first base layer 604 and the second base layer 606 are composed of Si, SiGe or InGaAs and/or having a p-type conductivity, and the emitter layer 603 is composed of Si, SiGe, InGaAs and/or InP having an n-type conductivity. According to at least one preferred embodiment, the base semiconductor material has a smaller bandgap than the emitter/collector. According to one example implementation, the emitter can be formed of InP, the base can be formed of InGaAs, the collector can be formed of InP or Si—SiGe—Si.

It is noted that in some instances a silicon or silicon germanium material may be substituted for the aforementioned type III-V semiconductor materials that are provided for the emitter region and the base region.

Figure 19:
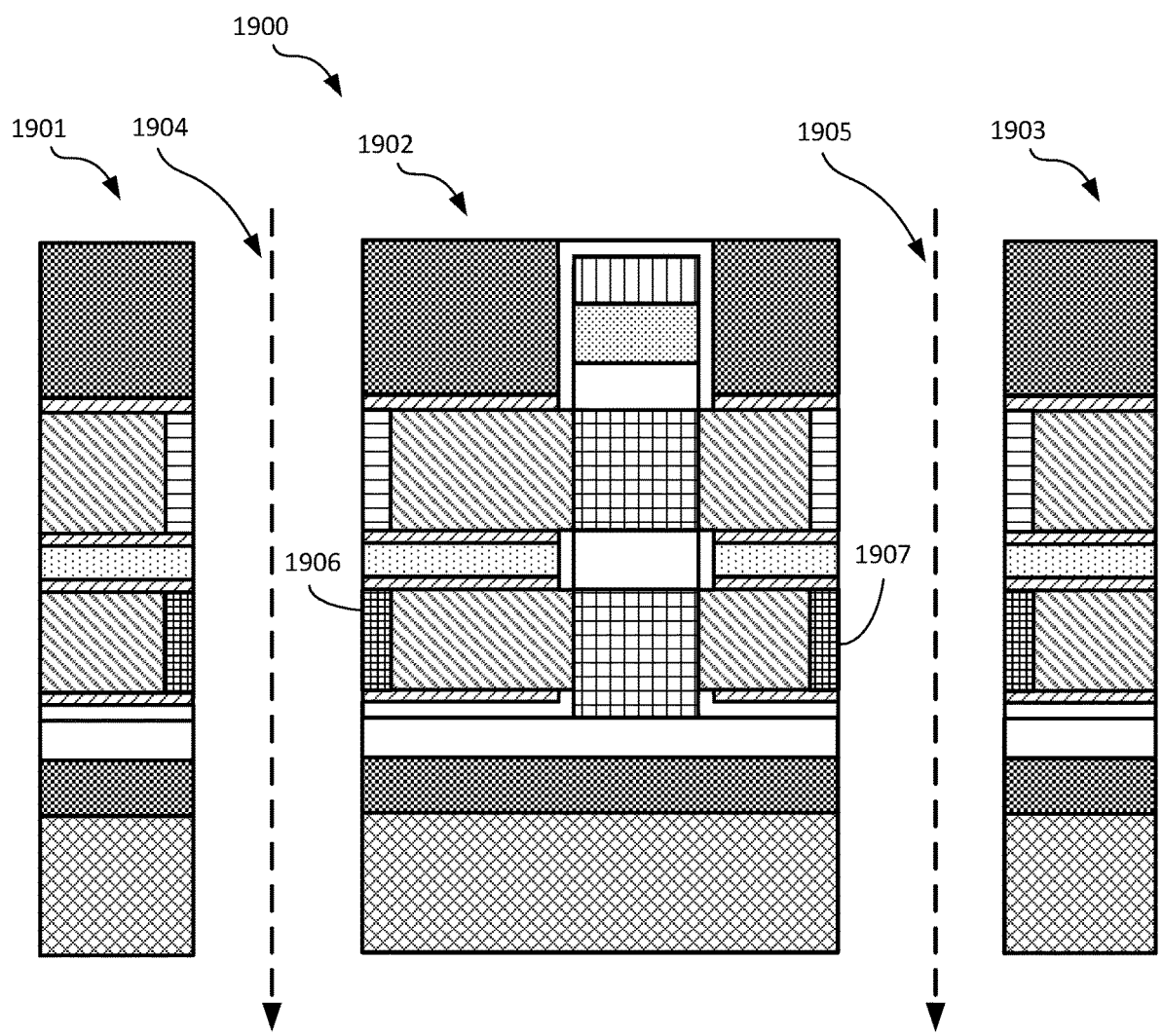
FIG. 19 is a cross-section view of a dual-base/dual-sensing surface bipolar junction transistor sensing device at different steps in a manufacturing process according to one or more embodiments of the present invention.

FIG. 19 is a cross-section view of a dual-base/dual-sensing surface bipolar junction transistor device 1902 according to one or more embodiments of the present invention. Referring to FIG. 19 and according to some aspects, the dual-base/dual-sensing surface bipolar junction transistor device 1902 shares a first sensing trench 1904 with a first neighboring dual-base/dual-sensing surface bipolar junction transistor device 1901 and shares a second sensing trench 1904 with a second neighboring dual-base/dual-sensing surface bipolar junction transistor device 1905. In some embodiments, the dual-base/dual-sensing surface bipolar junction transistor device 1902 is used for differential sensing. For example, the first sensing trench 1904 may be used for sensing a known (e.g., reference or calibrated) species and the second sensing trench 1904 may be used for sensing a species of interest with respect to the known species in the first sensing trench 1904.

According to some embodiments, a sensor array 1900, which can include two or more (e.g., 100's of sensors), wherein a sample (e.g., a liquid solution) can be run through the array, with multiple trenches/holes in a number of streams 1904-1905. According to some embodiments, the sensor array 1900 includes the dual-base/dual-sensing surface biosensing bipolar junction transistor device 1902, including a first sensing surface 1906 and a second sensing surface 1907, arranged between a second biosensing bipolar junction transistor device 1901 of the array and a third biosensing bipolar junction transistor device 1903 of the array. It should be understood that the second biosensing bipolar junction transistor device 1901 and the third biosensing bipolar junction transistor device 1903 can include a single sensing surface (e.g., see FIG. 17) or dual sensing surfaces. That is, the sensor array 1900 can include only dual sensing surface devices, or a mix of single and dual sensing surface devices.

Recapitulation:

According to embodiments of the present invention, a sensor device 200 includes: a vertically stacked cascode bipolar junction transistor pair including: a resistor 202; an NPN bipolar junction transistor 203 connected to the resistor; and a dual-base NPN bipolar junction transistor 204 comprising a sensing base and a first sensing surface 205 connected to the sensing base; and a first trench (i.e., trench/hole 1707) having a first sidewall, wherein a portion of the first sidewall is provided by the first sensing surface, wherein the NPN bipolar junction transistor and the dual-base NPN bipolar junction transistor are stacked vertically along the first trench.

According to some embodiments, a sensor device (i.e., second dual-base bipolar junction transistor sensor 300) includes: a vertically stacked cascode bipolar junction transistor pair including: a dual-base PNP bipolar junction transistor 302 comprising a sensing base and a first sensing surface (i.e., second sensing surface 303) connected to the sensing base; a PNP bipolar junction transistor 304 connected to the dual-base PNP bipolar junction transistor; and a resistor (i.e., second resistor 305); and a first trench (i.e., trench/hole 1707) having a first sidewall, wherein a portion of the first sidewall is provided by the first sensing surface, wherein the PNP bipolar junction transistor and the dual-base PNP bipolar junction transistor are stacked vertically along the first trench.

According to some embodiments, a method of manufacturing a sensor device including a vertically stacked cascode bipolar junction transistor pair, wherein the method includes providing a stack at step 101 including a substrate, an isolation layer, an emitter layer, a first base layer, a collector-emitter layer, a second base layer, a collector layer, and a resistor layer; patterning the stack at step 102 to form a first fin and a second fin; sequentially forming an oxide liner at step 103, a bottom spacer material at step 104, a first sacrificial material at step 105, a first spacer layer at step 106, a second sacrificial material at step 109, a third spacer layer at step 110, and a silicon oxide layer at step 111; forming a first sample trench between the first fin and the second fin at step 113; forming first cavities by removing the first sacrificial material and the second sacrificial material at step 114; forming a plurality of extrinsic bases at step 115 in the first cavities, the plurality of extrinsic bases including an upper extrinsic base and a lower extrinsic base; forming vertical cavities in the plurality of extrinsic bases at step 116; forming vertical spacers at step 117 in the vertical cavities, the vertical spacers including an upper vertical spacer and a lower vertical spacer; forming a hanging spacer at step 118, which protects the upper extrinsic base and the upper vertical spacer; and replacing the lower vertical spacer with a metal sensing surface at steps 119-121, wherein a portion of a sidewall of the first sample trench is provided by the metal sensing surface, wherein the first sample trench extends through the sensor device.

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A sensor device comprising:
a vertically stacked cascode bipolar junction transistor pair comprising:

a resistor;
an NPN bipolar junction transistor connected to the resistor; and
a dual-base NPN bipolar junction transistor comprising a sensing base and a first sensing surface connected to the sensing base; and
a first trench having a first sidewall, wherein a portion of the first sidewall is provided by the first sensing surface,
wherein the NPN bipolar junction transistor and the dual-base NPN bipolar junction transistor are stacked vertically along the first trench.

2. The sensor device of claim 1, wherein the first trench extends entirely through the sensor device and is configured to pass a sample through the sensor device.

3. The sensor device of claim 1, further comprising a bias voltage contact applying a bias voltage to a base of the NPN bipolar junction transistor.

4. The sensor device of claim 1, further comprising a control contact applying a control voltage to a control base of the dual-base NPN bipolar junction transistor.

5. The sensor device of claim 1, further comprising an emitter of the NPN bipolar junction transistor electrically connected to a collector of the dual-base NPN bipolar junction transistor, and an emitter of the dual-base NPN bipolar junction transistor connected to a ground.

6. The sensor device of claim 1, further comprising a second sensing surface connected to the sensing base of the dual-base NPN bipolar junction transistor.

7. The sensor device of claim 6, further comprising a second trench having a second sidewall, wherein a portion of the second sidewall is provided by the second sensing surface.

8. The sensor device of claim 1, further comprising a voltage supply configured to supply a voltage to the vertically stacked cascode bipolar junction transistor pair.

9. The sensor device of claim 1, further comprising a voltage output connected between the resistor and the NPN bipolar junction transistor.

10. A sensor device comprising:
a vertically stacked cascode bipolar junction transistor pair comprising:
a dual-base PNP bipolar junction transistor comprising a sensing base and a first sensing surface connected to the sensing base;
a PNP bipolar junction transistor connected to the dual-base PNP bipolar junction transistor; and
a resistor; and
a first trench having a first sidewall, wherein a portion of the first sidewall is provided by the first sensing surface,
wherein the PNP bipolar junction transistor and the dual-base PNP bipolar junction transistor are stacked vertically along the first trench.

11. The sensor device of claim 10, wherein the first trench extends entirely through the sensor device and is configured to pass a sample through the sensor device.

12. The sensor device of claim 10, further comprising a bias voltage contact applying a bias voltage to a base of the PNP bipolar junction transistor.

13. The sensor device of claim 10, further comprising a control contact applying a control voltage to a control base of the dual-base PNP bipolar junction transistor.

14. The sensor device of claim 10, further comprising an emitter of the dual-base PNP bipolar junction transistor electrically connected to a voltage supply, a collector of the dual-base PNP bipolar junction transistor electrically connected to an emitter of the PNP bipolar junction transistor, and a collector of the PNP bipolar junction transistor connected to the resistor, wherein the resistor is electrically connected to a ground.

15. The sensor device of claim 10, further comprising a second sensing surface connected to the sensing base of the dual-base PNP bipolar junction transistor.

16. The sensor device of claim 15, further comprising a second trench having a second sidewall, wherein a portion of the second sidewall is provided by the second sensing surface.

17. The sensor device of claim 10, further comprising a voltage supply configured to supply a voltage to the vertically stacked cascode bipolar junction transistor pair.

18. The sensor device of claim 10, further comprising a voltage output connected between the resistor and the PNP bipolar junction transistor.

19. A method of manufacturing a sensor device comprising a vertically stacked cascode bipolar junction transistor pair, the method comprising:
providing a stack including a substrate, an isolation layer, an emitter layer, a first base layer, a collector-emitter layer, a second base layer, a collector layer, and a resistor layer;
patterning the stack to form a first fin and a second fin;
sequentially forming an oxide liner, a bottom spacer material, a first sacrificial material, a first spacer layer, a second sacrificial material, a third spacer layer, and a silicon oxide layer;
forming a first sample trench between the first fin and the second fin;
forming first cavities by removing the first sacrificial material and the second sacrificial material;
forming a plurality of extrinsic bases in the first cavities, the plurality of extrinsic bases including an upper extrinsic base and a lower extrinsic base;
forming vertical cavities in the plurality of extrinsic bases;
forming vertical spacers in the vertical cavities, the vertical spacers including an upper vertical spacer and a lower vertical spacer;
forming a hanging spacer, which protects the upper extrinsic base and the upper vertical spacer; and
replacing the lower vertical spacer with a metal sensing surface, wherein a portion of a sidewall of the first sample trench is provided by the metal sensing surface, wherein the first sample trench extends through the sensor device.

20. The method of claim 19, further comprising forming, simultaneously, a second sample trench, wherein a second metal sensing surface forms a portion of a sidewall of the second sample trench and is connected to the lower extrinsic base.

* * * * *